United States Patent [19]
Jeong

[11] Patent Number: 5,960,310
[45] Date of Patent: Sep. 28, 1999

[54] POLISHING METHODS FOR FORMING A CONTACT PLUG

[75] Inventor: In-kwon Jeong, Kyungki-do, Rep. of Korea

[73] Assignee: Samsung Electronics Co., Ltd., Rep. of Korea

[21] Appl. No.: 08/942,859

[22] Filed: Oct. 2, 1997

[30] Foreign Application Priority Data

Dec. 20, 1996 [KR] Rep. of Korea .................. 96-69325

[51] Int. Cl.⁶ .......................................... H01L 21/4763
[52] U.S. Cl. .................. 438/622; 438/627; 438/629; 438/631; 438/633; 438/637
[58] Field of Search .................... 438/622, 627, 438/631, 637, 629, 633

[56] References Cited

U.S. PATENT DOCUMENTS

| | | | |
|---|---|---|---|
| 4,944,836 | 7/1990 | Beyer et al. | 156/645 |
| 4,956,313 | 9/1990 | Cote et al. | 437/203 |
| 5,073,518 | 12/1991 | Doan et al. | 437/180 |
| 5,143,820 | 9/1992 | Kotecha et al. | 430/314 |
| 5,358,903 | 10/1994 | Kim . | |
| 5,726,099 | 3/1998 | Jaso . | |
| 5,804,503 | 9/1998 | Leidy et al. . | |
| 5,840,625 | 11/1998 | Feldner . | |

OTHER PUBLICATIONS

Wolf, Stanley, "Silicon Processing for the VLSI Era, vol. 1", Lattice Press, Sunset Beach, pp. 121–122 and 124, 1990.

*Primary Examiner*—John F. Niebling
*Assistant Examiner*—Josetta Jones
*Attorney, Agent, or Firm*—Myers, Bigel, Sibley & Sajovec

[57] ABSTRACT

A method for forming a contact plug for a microelectronic device includes the step of forming an insulating layer on a microelectronic substrate having a first conductive layer. A contact hole is formed in the insulating layer wherein the contact hole exposes a portion of the first conductive layer, and a second conductive layer is formed on the insulating layer opposite the microelectronic substrate and in the contact hole. The second conductive layer is polished thereby exposing a surface of the insulating layer, and the insulating layer is polished thereby planarizing a surface thereof.

39 Claims, 9 Drawing Sheets

POLISHING METHODS FOR FORMING A CONTACT PLUG

FIELD OF THE INVENTION

The present invention relates to the field of microelectronics and more particularly to methods for forming contact plugs.

BACKGROUND OF THE INVENTION

Patterned wiring layers allow the transmission of electronic signals between different portions of a semiconductor device. Multiple patterned wiring layers can be provided on a semiconductor device wherein each wiring layer is separated by an insulating layer. Portions of upper and lower wiring layers can thus be connected by contact plugs through the insulating layer therebetween.

FIGS. 1A to 1D are cross-sectional views illustrating steps of a method for forming a contact plug according to the prior art. As shown in FIG. 1D, the completed structure includes a semiconductor substrate 1, an interlayer insulating layer 3, a patterned wiring layer 5, an insulating layer 7, a contact hole 8, a barrier layer 9, and a conductive layer 11. As shown in FIG. 1A, a layer of a metal such as aluminum is deposited on the insulating layer 3 and patterned to provide the patterned wiring layer 5 on the insulating layer 3 opposite the substrate 1. The insulating layer 7 is then deposited on the patterned wiring layer 5 and the insulating layer 3. As shown, the insulating layer 7 may have steps therein due to the patterned wiring layer 5.

The insulating layer 7 is then planarized using a chemical-mechanical polishing (CMP) step. The chemical-mechanical polishing step is performed for a predetermined period of time so that the planarized insulating layer 7 of FIG. 1B has a desired thickness. A cleaning step such as a spin scrub is then performed to remove particles generated during the polishing step.

As shown in FIG. 1C, the planarized insulating layer 7 is selectively etched to form contact holes 8 therein exposing surface portions of the patterned wiring layer 5. This selective etch can be performed using photolithographic techniques. A titanium (Ti) layer and a titanium nitride (TiN) layer are sequentially deposited on the insulating layer 7 and in the contact hole 8 to provide the barrier layer 9 having a titanium nitride/titanium structure. Tungsten (W) is then deposited on the barrier layer 9 thereby providing the conductive layer 11.

As shown in FIG. 1D, the conductive layer 11 and the barrier layer 9 are polished back using a chemical-mechanical polishing step until the planarized insulating layer 7 is exposed. In particular, a polishing agent is used wherein the polishing rate of the conductive layer 11 and the barrier layer 9 is roughly the same as the polishing rate of the insulating layer 7. Accordingly, the contact plug 11 is provided including the remaining portions of the conductive layer 11 and the barrier layer 9 in the contact hole 8. Because the planarized insulating layer 7 may not provide an effective polishing stop, it may be difficult to accurately end the polishing step. In addition, a cleaning step can be used to remove particles generated during the polishing step.

According to the method discussed above, the polishing step may need to be performed in a chemical-mechanical polishing (CMP) system, and the cleaning step may need to be performed in a separate cleaning system thereby complicating the method.

SUMMARY OF THE INVENTION

It is therefore an object of the present invention to provide improved methods for forming contact plugs in insulating layers.

This and other objects are provided according to the present invention by a method including the step of forming an insulating layer on a microelectronic substrate including a first conductive layer. A contact hole is formed on the insulating layer wherein the contact hole exposes a portion of the first conductive layer, and a second conductive layer is formed on the insulating layer opposite the microelectronic substrate and in the contact hole. The second conductive layer is polished thereby exposing a surface of the insulating layer, and the insulating layer is polished thereby planarizing the surface thereof.

Preferably, the steps of polishing the second conductive layer and polishing the insulating layer comprise separate chemical-mechanical polishing steps wherein the step of polishing the second conductive layer is performed on a first polishing plate of a chemical-mechanical polishing system, and wherein the step of polishing the insulating layer is performed on a second polishing plate of the chemical-mechanical polishing system. In other words, the two polishing steps can be performed in-situ using a single chemical-mechanical polishing system. Moreover, the step of polishing the second conductive layer can be performed using a polishing agent that polishes away the second conductive layer at a higher rate than the insulating layer. Similarly, the step of polishing the insulating layer can be performed using a polishing agent that polishes away the insulating layer at a higher rate than the second conductive layer.

The second conductive layer can include a material chosen from the group including a metal, a metal compound, and polycrystalline silicon. The insulating layer can include a material chosen from the group including $SiO_2$, undoped silicate glass, boron phosphorous silicate glass, phosphorous silicate glass, SiOF, SiN, SiON, spin-on-glass, a flowable oxide, or an insulating polymer. The second conductive layer can include a material chosen from the group including tungsten, aluminum, copper, polycrystalline silicon, a tungsten-silicon compound, an aluminum-copper compound, or an aluminum-copper-silicon compound.

The method can further include the step of forming a dummy pattern on the microelectronic substrate between portions of the first conductive layer. Moreover, the steps of forming the first conductive layer and forming the dummy pattern can be performed simultaneously. In addition, the method can include the step of cleaning the microelectronic substrate between the steps of polishing the second conductive layer and polishing the insulating layer. Furthermore, the method can include the step of forming a barrier layer on the insulating layer and in the contact hole wherein the step of polishing the second conductive layer includes polishing the barrier layer thereby exposing the insulating layer. This barrier layer can include a material chosen from the group including titanium, titanium nitride, and tungsten nitride.

According to an alternate aspect of the present invention, a method can include the step of forming a first insulating layer on a microelectronic substrate including a first conductive layer wherein the first insulating layer has recessed portions therein. A second insulating layer is formed in the recessed portions of the first insulating layer, and a third insulating layer is formed on the first and second insulating layers. A contact hole is formed in the first and third insulating layers wherein the contact hole exposes a portion of the first conductive layer. A second conductive layer is formed on the insulating layer opposite the microelectronic substrate and in the contact hole, and the second conductive layer is polished thereby exposing a surface of the insulating layer. The third insulating layer is then polished thereby planarizing the surface thereof.

According to the methods discussed above, the multiple polishing steps can be performed in-situ using a single chemical-mechanical polishing system including multiple polishing pads. The method for forming the contact plugs can thus be simplified.

DETAILED DESCRIPTION

Figure 1A:
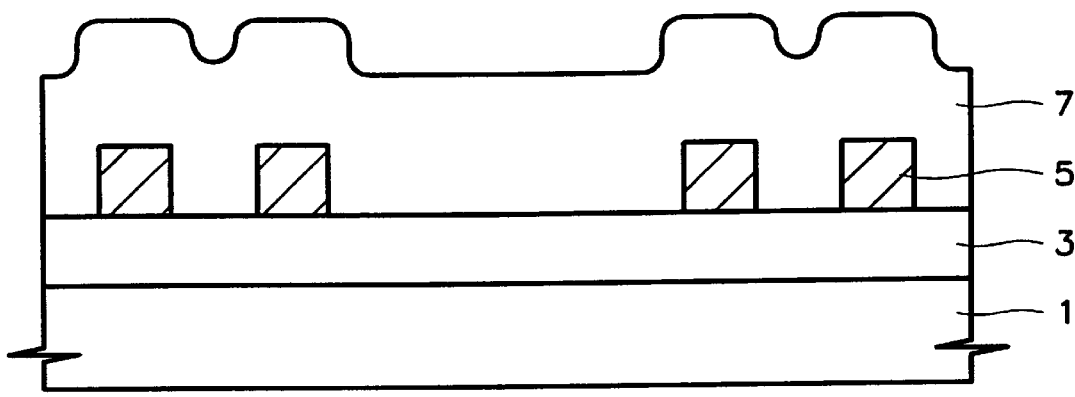
FIGS. 1A to 1D are cross-sectional views illustrating steps of a method for forming contact plugs according to the prior art.
Figure 1B:
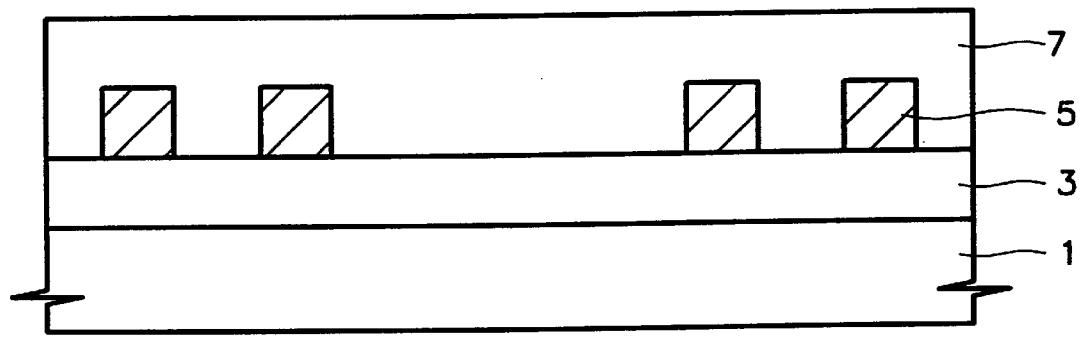
Figure 1C:
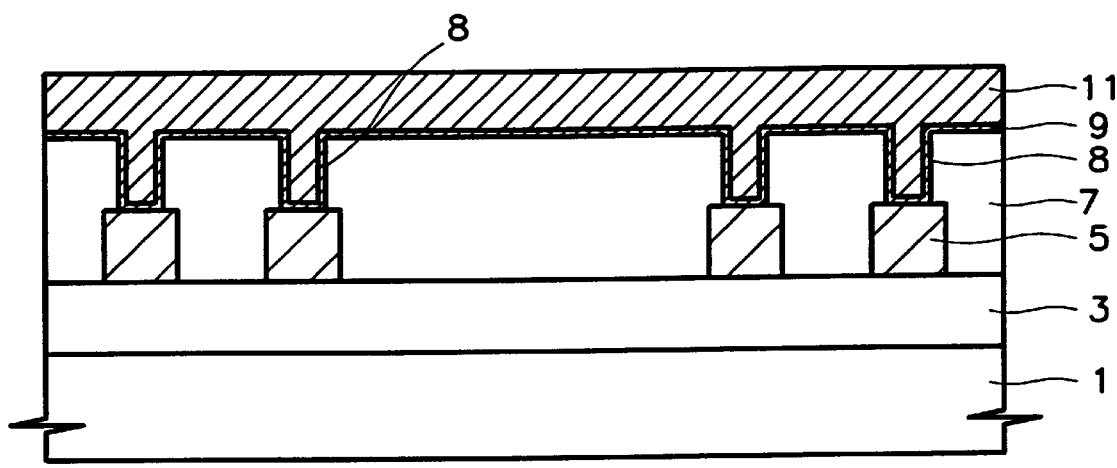
Figure 1D:
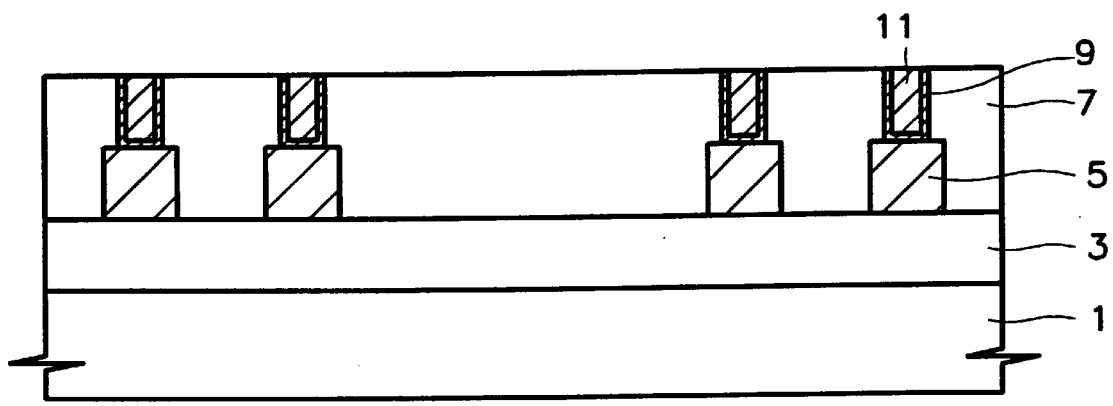

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

FIGS. 2A to 2D illustrate steps of a first method for forming contact plugs for a microelectronic device according to the present invention. The various elements illustrated in these figures include the insulating layer 33, the patterned wiring layer 35, the insulating layer 37, the contact hole 38, the barrier layer 39, and the conductive layer 41.

Figure 2A:
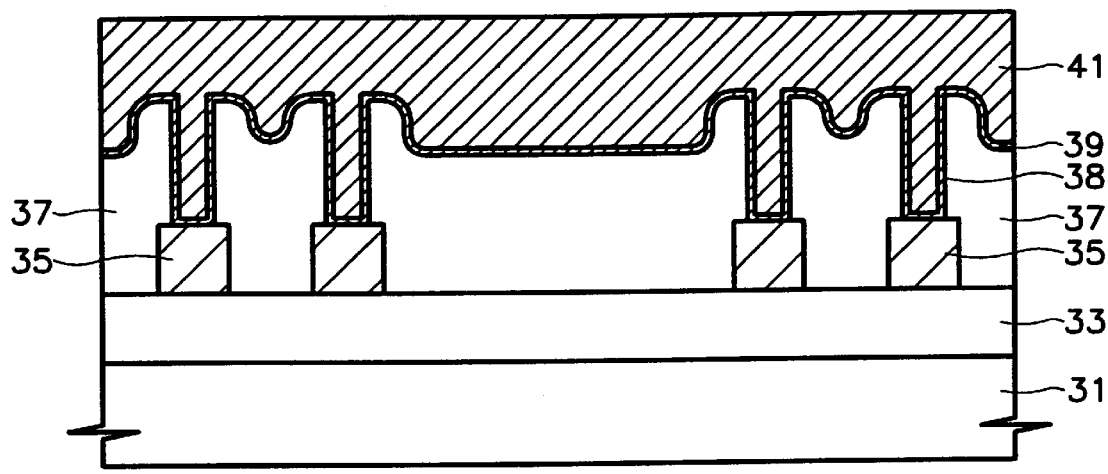
FIGS. 2A to 2D are cross-sectional views illustrating steps of a method for forming contact plugs for a microelectronic device according to the present invention.

As shown in FIG. 2A, a conductive layer is deposited on the insulating layer 33 and patterned to provide the patterned wiring layer 35. The insulating layer 37 is then deposited on the patterned wiring layer 35 and the insulating layer 33. The insulating layer 37 is then selectively etched using a photolithographic technique to form the contact holes 38 thereby exposing portions of the patterned wiring layer 35. The barrier layer 39 is formed on the insulating layer 37 and in the contact holes 38, and the conductive layer 41 is formed on the barrier layer 39 and in the contact holes 38.

Moreover, the patterned wiring layer 35 can be formed from a layer of a metal such as aluminum (Al). The insulating layer 37 can be formed from a layer of $SiO_2$, a layer of undoped silicate glass (USG), a layer of boron phosphorous silicate glass (BPSG), a layer of phosphorous silicate glass (PSG), a layer of SiOF, a layer of SiN, a layer of SiON, a layer of spin-on-glass (SOG), a layer of a flowable oxide, or a layer of an insulating polymer. Alternately, the insulating layer 37 can be formed from multiple layers of the above-mentioned materials. In addition, the insulating layer 37 can be formed using a low pressure chemical vapor deposition (LPCVD), a plasma enhanced chemical vapor deposition (PECVD), or a spin coating.

The barrier layer 39 can have a TiN/Ti structure wherein a titanium nitride (TiN) layer is deposited on a titanium (Ti) layer. Alternately, the barrier layer 39 can be formed from a layer of a refractory metal such as titanium (Ti), titanium nitride (TiN), or tungsten nitride ($Wn_x$). The barrier layer 39 can also include multiple layers of the above-mentioned materials. The conductive layer 41 can include a material such as tungsten (W), aluminum (Al), copper (Cu), polycrystalline silicon, a tungsten-silicon compound, an aluminum-copper compound, or an aluminum-copper-silicon compound.

Figure 2B:
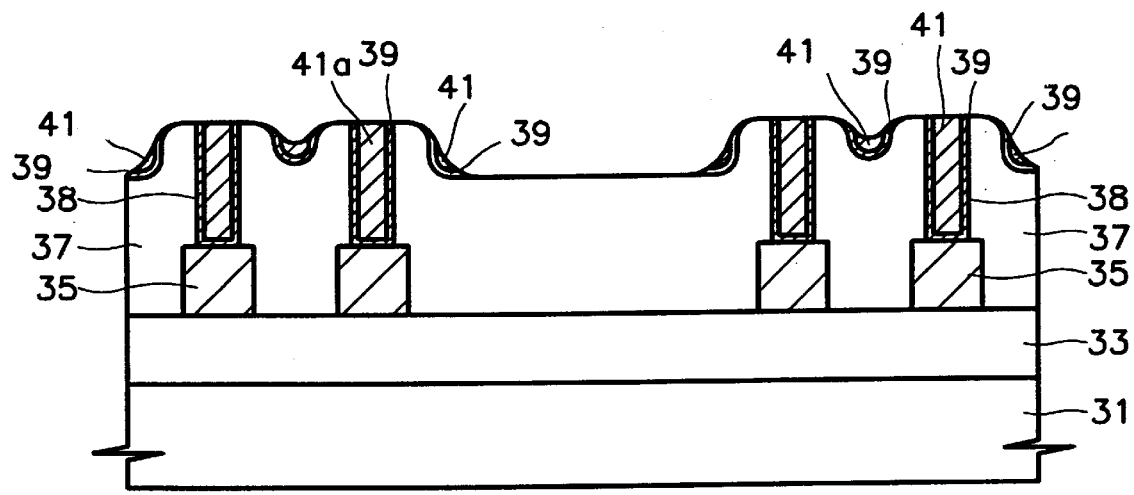

The conductive layer 41 and the barrier layer 39 are then etched back using a chemical-mechanical polishing step until the insulating layer 37 is exposed as shown in FIG. 2B. The chemical-mechanical polishing step is performed using a polishing agent which polishes away the conductive layer 41 at a significantly higher rate than it polishes away the insulating layer 37. Furthermore, this chemical-mechanical polishing step can be performed on a first polishing plate of a chemical-mechanical polishing system having a plurality of polishing plates. The contact hole 38 is thus filled with the conductive layer 41 and the barrier layer 39. At this time, however, the conductive layer 41 and the barrier layer 39 may not be completely removed from recesses in the insulating layer 37 as shown in FIG. 2B. In other words, portions of the conductive layer 41 and the barrier layer 39 may remain on portions of the insulating layer 37 between the contact holes 38.

Figure 2C:
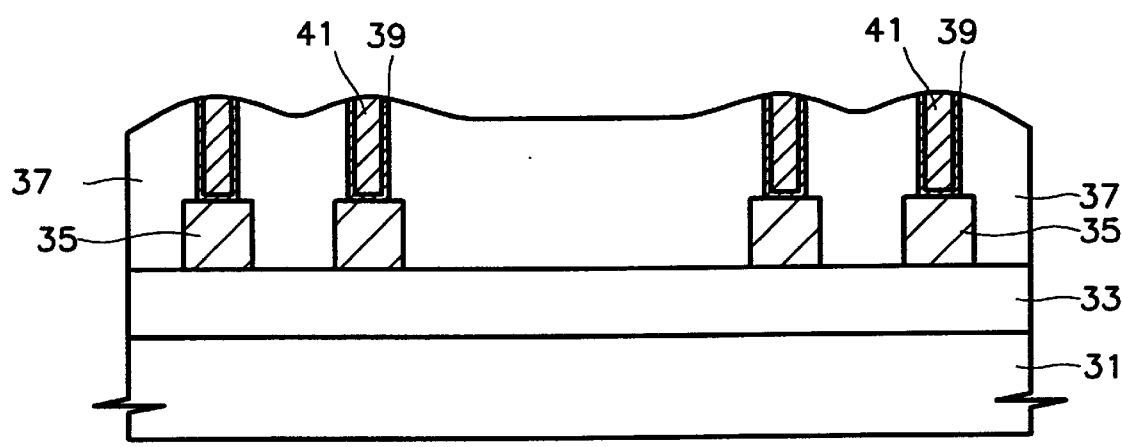

As shown in FIG. 2C, the conductive layer 41 and the barrier layer 39 are then over-polished to remove portions of the conductive layer and the barrier layer remaining on the insulating layer 37 as shown in FIG. 2C. In particular, portions of the insulating layer 37 may be removed along with the remaining portions of the conductive layer 41 and the barrier layer 39 thereon. Accordingly, only portions of the barrier layer 39 and conductive layer 41 in the contact holes 38 remain. This chemical-mechanical polishing step is performed using a polishing agent which polishes away the conductive layer 41 and barrier layer 39 at a rate significantly higher than it polishes away the insulating layer 37. This over-polishing step can be performed on the same polishing plate of the chemical-mechanical polishing system used to polish the conductive layer and the barrier layer in FIG. 2B.

Figure 2D:
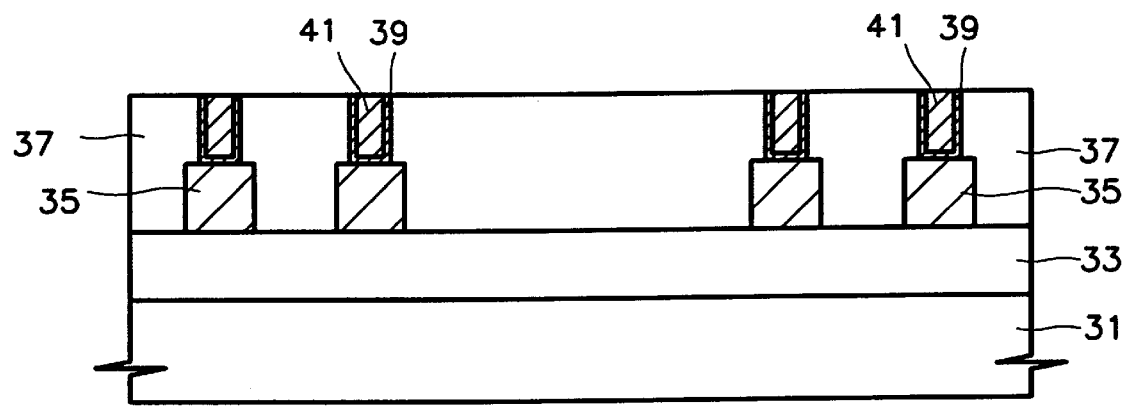

The insulating layer 37 is then planarized using a chemical-mechanical polishing step to form the planarized insulating layer 37 as shown in FIG. 2D. This step can be performed on a second polishing plate of the chemical-mechanical polishing system used in the steps of FIGS. 2B and 2C. This chemical-mechanical polishing step is performed using a polishing agent that polishes away the insulating layer 37 at a significantly higher rate than it polishes away the material layer 41. The contact plugs are thus provided in the contact holes including portions of the conductive layer 41 and the barrier layer 39, and the planarized insulating layer 37 is obtained as shown in FIG. 2D.

The duration of this polishing step can be controlled to provide a planar insulating layer 37 having a predetermined thickness and contact plugs therein including a conductive layer 41 and a barrier layer 39. A cleaning step is then performed using Dl water to remove particles generated during the polishing step. Moreover, this cleaning step can be performed using a polishing plate with a cleaning polishing pad attached thereto installed in the chemical-mechanical polishing system discussed above. The polishing steps of FIGS. 2C and 2D can thus be performed in-situ using a single chemical-mechanical polishing system thereby simplifying the method for forming the contact plug.

The cleaning step is preferably performed before the insulating layer 37 is planarized. In general, the polishing agent used to polish away the conductive layer 41 and the barrier layer 39 is an acid, and the polishing agent used to polish away the insulating layer 37 is a base. Accordingly, when the semiconductor substrate 31 is transferred to the second polishing plate to polish the insulating layer 37 after polishing the conductive layer 41 and the barrier layer 39, particles generated during the polishing step may adhere over the semiconductor substrate 31 as a result of a change in pH. Accordingly, a cleaning step may be needed after polishing the conductive layer 41 and the barrier layer 39.

FIGS. 3A to 3D are cross-sectional views illustrating steps of a second method for forming contact plugs for a microelectronic device according to the present invention. As shown, the structure includes a semiconductor substrate 51, an interlayer insulating layer 53, a patterned wiring layer 55a, a dummy pattern 55b, an insulating layer 57, a contact hole 58, a barrier layer 59, and a conductive layer 61.

Figure 3A:
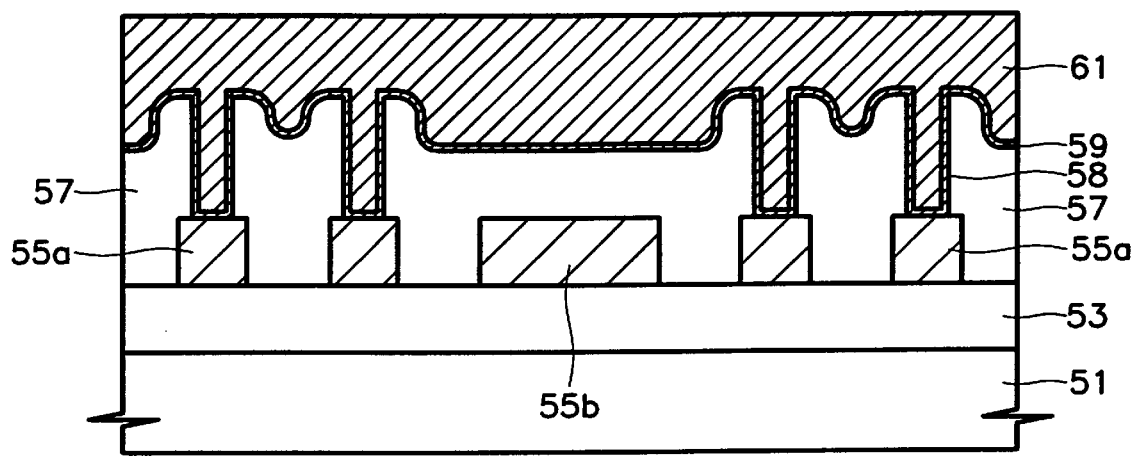
FIGS. 3A to 3D are cross-sectional views illustrating steps of a second method for forming contact plugs for a microelectronic device according to the present invention.

As shown in FIG. 3A, a conductive layer is deposited on the interlayer insulating layer 53 opposite the substrate 51, and this conductive layer is patterned to form the patterned wiring layer 55a and the dummy pattern 55b. An insulating layer 57 is then deposited on the interlayer insulating layer 53 and on the patterned wiring layer 55a and the dummy pattern 55b. This insulating layer 57 is then selectively etched using a photolithographic technique to provide the contact holes 58 thereby exposing portions of the patterned wiring layer 55a. A barrier layer 59 is formed on the insulating layer 57 and in the contact holes 58, and a conductive layer 61 is formed on the barrier layer 59 and in the contact holes 58. In particular, the conductive layer 61 can be a layer of a low-resistance metal, a compound of a low-resistance metal, or polycrystalline silicon.

The patterned wiring layer 55a and the dummy pattern 55b can be formed from a metal such as aluminum (Al). The dummy pattern 55b is used to reduce the unevenness of the insulating layer 57 formed thereon. In particular, the dummy pattern 55b reduces the interval between raised portions of the patterned wiring layer 55a. Moreover, the dummy pattern 55b is preferably isolated from the patterned wiring layer 55a by a distance in the range of 1 $\mu$m to 1,000 $\mu$m so that the dummy pattern 55b does not contact the patterned wiring layer 55a.

The insulating layer 57 can be a layer of SiO$_2$, a layer of undoped silicate glass (USG), a layer of boron phosphorous silicate glass (BPSG), a layer of phosphorous silicate glass (PSG), a layer of SiOF, a layer of SiN, a layer of SiON, a layer of spin-on-glass (SOG), a layer of a flowable oxide, or a layer of an insulating polymer. Alternately, the insulating layer 57 can be formed from multiple layers of the above-mentioned materials. Furthermore, the insulating layer 57 can be formed using a low pressure chemical vapor deposition (LPCVD), a plasma enhanced chemical vapor deposition (PECVD), or a spin coating technique.

Figure 3B:
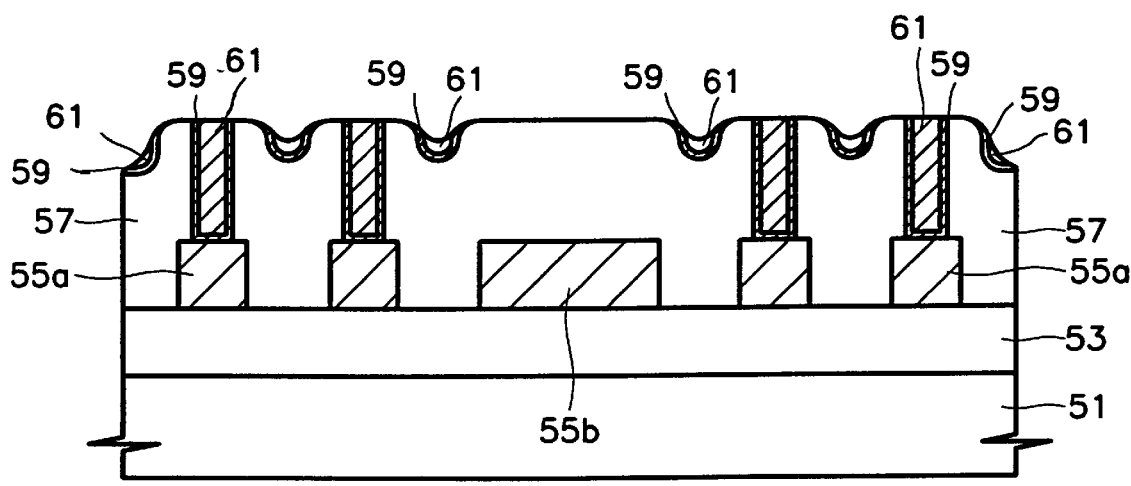
Figure 3C:
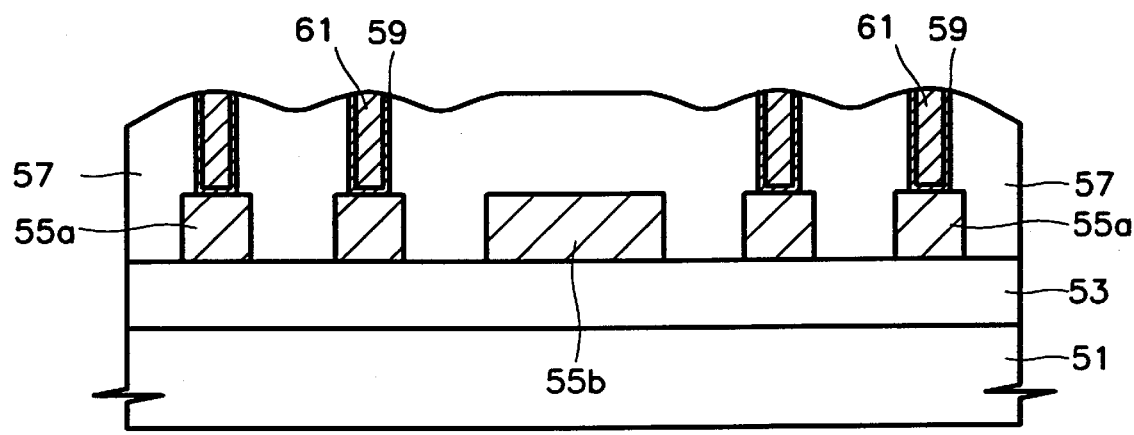
Figure 3D:
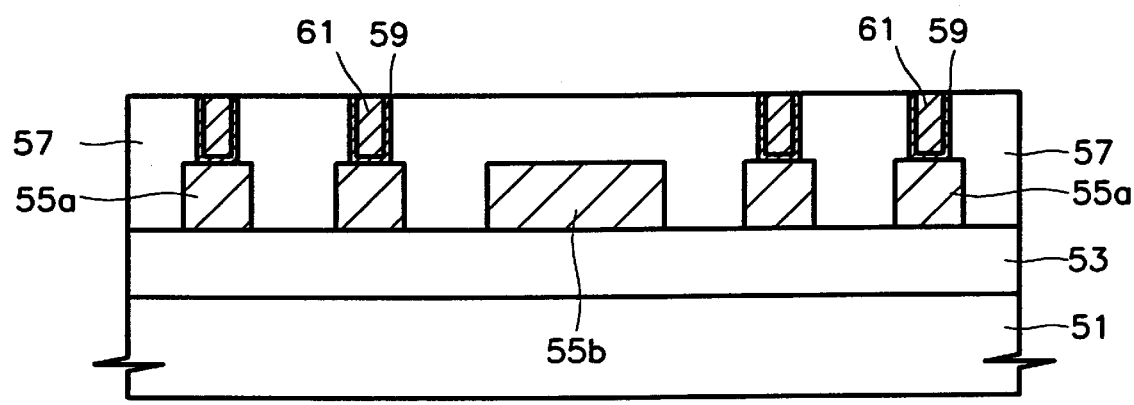

The barrier layer 59 can have a TiN/Ti structure formed by depositing a titanium nitride (TiN) layer on a titanium (Ti) layer, and the barrier layer 59 reduces diffusion of the conductive layer 61 to the insulating layer 57. Alternately, the barrier layer 59 can be a layer of a refractory metal such as titanium (Ti), titanium nitride (TiN), or tungsten nitride (Wn$_x$). Alternately, multiple layers of the above-mentioned materials can be used to form the barrier layer. The conductive layer 61 can be a layer of tungsten (W), a layer of aluminum (Al), a layer of copper (Cu), a layer of polycrystalline silicon, a layer of a tungsten-silicon compound, a layer of an aluminum-copper compound, or a layer of an aluminum-copper-silicon compound. The steps of FIGS. 3B to 3D are the same as those discussed above with reference to FIGS. 2B to 2D. Using the method of FIGS. 3A to 3D, however, the insulating layer 57 may be more easily planarized because the dummy pattern 55b lessens the steps in the insulating layer 57.

FIGS. 4A to 4G are cross-sectional views illustrating steps of a third method for forming a contact plug for a semiconductor device according to the present invention. As shown, the structure includes a semiconductor substrate 71, an interlayer insulating layer 73, patterned wiring layers 75a, 95a, and 115a, dummy patterns 75b, 95b, and 115b, a first insulating layer 71, a second insulating layer 79, and a third insulating layer 81. The structure also includes a contact hole 82, a first barrier layer 83, a second barrier layer 103, a first conductive layer 85, a fourth insulating layer 97, a fifth insulating layer 99, a sixth insulating layer 101, a second barrier layer 103, and a second conductive layer 105.

Figure 4A:
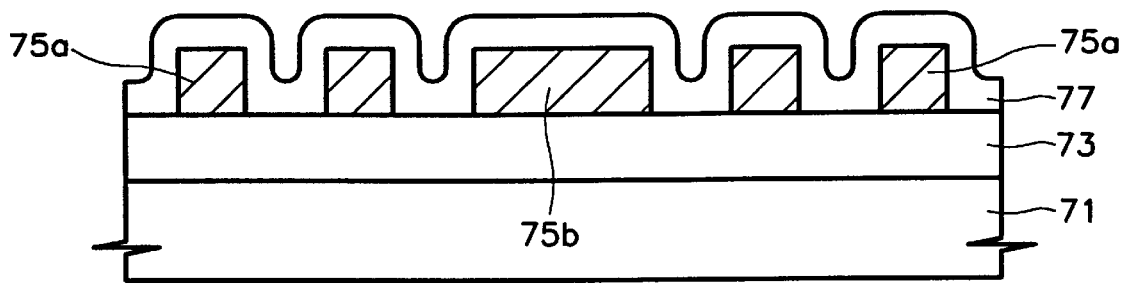
FIGS. 4A to 4G are cross-sectional views illustrating steps of a third method for forming contact plugs for a semiconductor device according to the present invention.

As shown in FIG. 4A, a conductive layer is deposited on the interlayer insulating layer 73 opposite the semiconductor substrate 71, and this conductive layer is patterned to provide the patterned wiring layer 75a. An insulating layer 77 is deposited on the interlayer insulating layer 73 and on the patterned wiring layer 75a. The patterned wiring layer 75a preferably includes a metal such as aluminum. As discussed above, the dummy pattern 75b reduces unevenness in the insulating layer 77 by reducing intervals between the raised portions of the patterned wiring layer 75a. Furthermore, the dummy pattern 75b is preferably isolated from the patterned wiring layer 75a by a distance in the range of 1 $\mu$m to 1,000 $\mu$m.

A first insulating layer 77 can be a layer of SiO$_2$, a layer of SiOF, a layer of SiN, a layer of SiON, a layer of undoped silicate glass (USG), or a layer of boron phosphorous silicate glass (BPSG). A first insulating layer can be formed by a low pressure chemical vapor deposition (LPCVD) or a plasma enhanced chemical vapor deposition (PECVD).

Figure 4B:
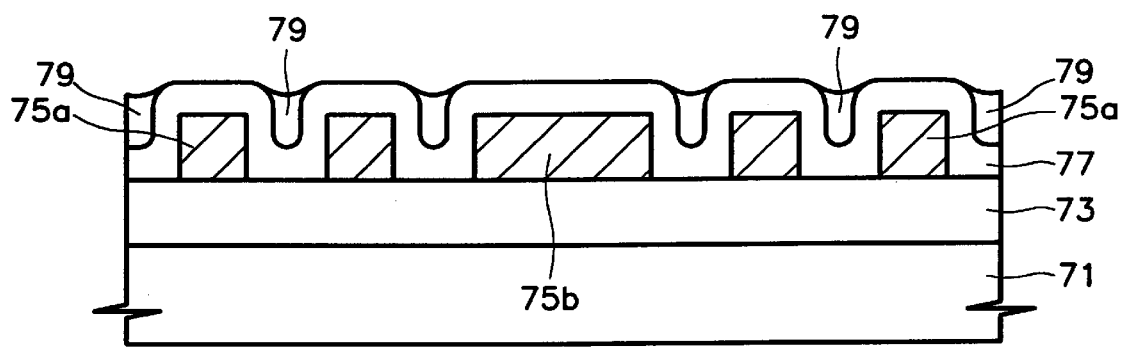

A shown in FIG. 4B, a spin-on-glass is deposited on the first insulating layer 77 and then etched back until portions of the first insulating layer 77 between recesses thereof are exposed. Accordingly, the second insulating layer 79 is provided thereby filling recesses in the first insulating layer 77. The etch back step used to planarize the first insulating layer 77 is thus relatively simple when compared to methods of the prior art using spin scrubbing steps after a chemical-mechanical polishing step. Manufacturing costs can thus be reduced. As discussed above, a second insulating layer 79 can be a layer of spin-on-glass. Alternately, the second insulating layer 79 can be a layer of a flowable oxide, or a layer of an insulating polymer.

Figure 4C:
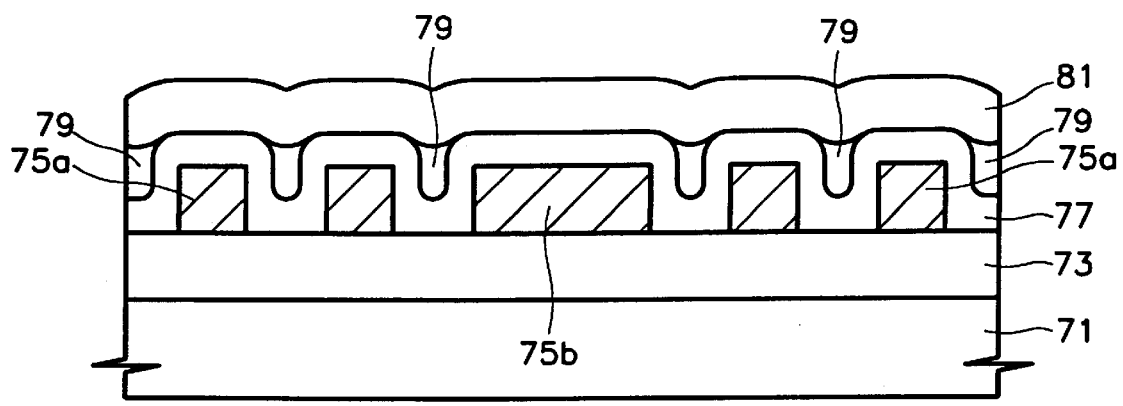

As shown in FIG. 4C, the third insulating layer 81 is formed on the first and second insulating layers opposite the semiconductor substrate. The third insulating layer 81 reduces exposure of the remaining portions of the second insulating layer 79 during subsequent polishing steps. The third insulating layer 81 can be a layer of SiO$_2$, a layer of SiOF, a layer of SiN, a layer of SiON, a layer of an undoped silicate glass (USG), or a layer of boron phosphorous silicate glass (BPSG). The third insulating layer can be formed using a low pressure chemical vapor deposition (LPCVD) or a plasma enhanced chemical vapor deposition (PECVD).

Figure 4D:
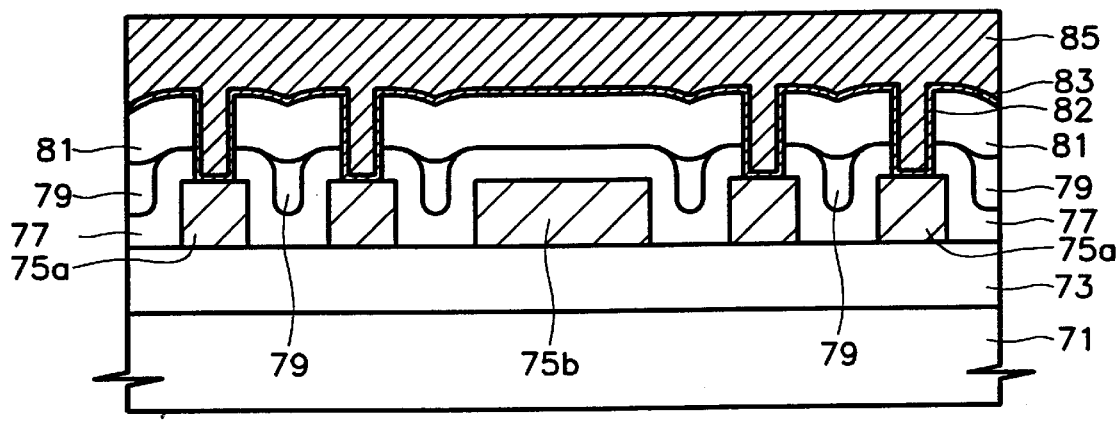

As shown in FIG. 4D, the second and third insulating layers 81 and 77 are selectively etched using a photolithographic technique to form the contact holes 82 thereby exposing portions of the patterned wiring layer 75a. The first barrier layer 83 is formed on the third insulating layer 81 and in the contact holes 82. A conductive layer 85 is then formed on the barrier layer 83. The conductive layer 85 can be a layer of a low-resistance metal, a compound of a low-resistance metal, or polycrystalline silicon.

The first barrier layer can have a TiN/Ti structure formed by depositing a titanium nitride (TiN) layer on a titanium (Ti) layer. The first barrier layer 83 can alternately be a layer of a refractory metal such as titanium (Ti), titanium nitride (TiN), or tungsten nitride ($Wn_x$). Alternately, the first barrier layer 83 can include multiple layers of the materials mentioned above. The first conductive layer 85 can be a layer of tungsten (W), a layer of aluminum (Al), a layer of copper (Cu), a layer of polycrystalline silicon, a layer of a tungsten-silicon compound, a layer of an aluminum-copper compound, or a layer of an aluminum-copper-silicon compound.

Figure 4E:
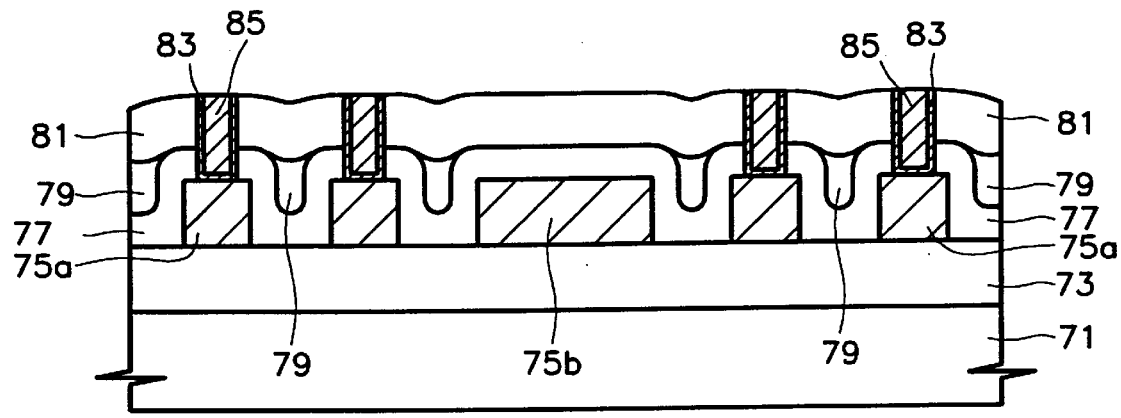

As shown in FIG. 4E, the first conductive layer 85 and the first barrier layer 83 are polished back using a chemical-mechanical polishing step until portions of the third insulating layer 81 between the contact holes is exposed. The chemical-mechanical polishing step can be performed using a polishing plate of a chemical-mechanical polishing system including a plurality of polishing plates. Moreover, this chemical-mechanical polishing step is performed using a polishing agent that polishes away the first conductive layer 85 and the barrier layer 83 at a rate significantly higher than it polishes away the third insulating layer 81.

Figure 4F:
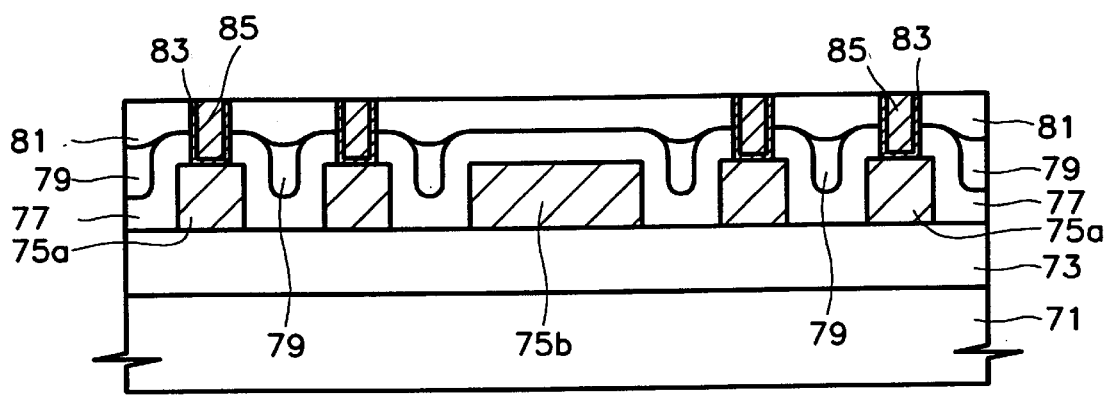

As shown in FIG. 4F, the third insulating layer 81 is then polished to thereby planarize the third insulating layer 81. This polishing step is preferably performed using a second polishing plate of the chemical-mechanical polishing system and using a polishing agent that polishes away the third insulating layer 81 at a rate significantly higher than a rate at which the first conductive layer 85 is polished away. A conductive plug including the remaining portions of the first conductive layer 85 and the first barrier layer 83 can thus be obtained. A more planarized third insulating layer 81 can also be obtained. The duration of the polishing step can be controlled to provide a contact plug and an insulating layer having a desired thickness. In addition, a cleaning step is preferably performed to remove particles generated on the semiconductor substrate during the polishing step. This cleaning step can be performed using a polishing plate to which a polishing pad is attached wherein the polishing pad is for cleaning. Moreover, this polishing plate and cleaning pad can be incorporated within the chemical-mechanical polishing system discussed above.

Figure 4G:
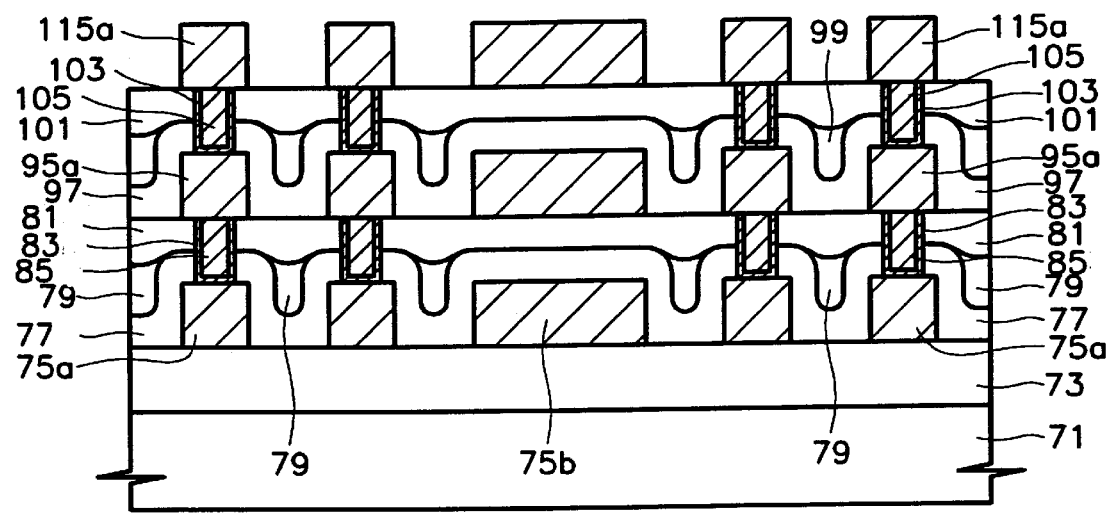

As shown in FIG. 4G, the steps of FIGS. 4A to 4F can be repeated on the third insulating layer 81 in which the first contact plugs are formed. Accordingly, a plurality of patterned wiring layers 75, 95, and 115 can be provided for the semiconductor device. In summary, a conductive layer for a contact plug and the insulating layer in which the contact plug is formed can be polished in-situ using a single chemical-mechanical polishing system thereby simplifying the manufacture thereof.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming a contact plug for a microelectronic device, said method comprising the steps of:
   forming an insulating layer on a microelectronic substrate having a first conductive layer wherein a portion of said insulating layer on said conductive layer is raised and wherein a portion of said insulating layer not on said conductive layer is recessed with respect to said raised portion of said insulating layer so that a surface of said insulating layer opposite said substrate is not planar;
   forming a contact hole in said raised portion of said insulating layer wherein said contact hole exposes a portion of said first conductive layer;
   forming a second conductive layer on said insulating layer including said raised and recessed portions opposite said microelectronic substrate and in said contact hole;
   polishing said second conductive layer thereby exposing said surface of said insulating layer; and
   after polishing said second conductive layer, polishing said insulating layer wherein said surface of said insulating layer is planarized during said step of polishing said insulating layer.

2. A method according to claim 1 wherein said second conductive layer comprises a material chosen from the group consisting of a metal, a metal compound, and polycrystalline silicon.

3. A method for forming a contact plug for a microelectronic device, said method comprising the steps of:
   forming an insulating layer on a microelectronic substrate having a first conductive layer;
   forming a contact hole in said insulating layer wherein said contact hole exposes a portion of said first conductive layer;
   forming a second conductive layer on said insulating layer opposite said microelectronic substrate and in said contact hole;
   polishing said second conductive layer thereby exposing a surface of said insulating layer;
   polishing said insulating layer; and
   forming a dummy pattern on said microelectronic substrate between portions of said first conductive layer.

4. A method according to claim 3 wherein said first conductive layer and said dummy pattern are formed simultaneously.

5. A method according to claim 1 wherein said insulating layer comprises a material chosen from the group consisting of $SiO_2$, undoped silicate glass, boron phosphorous silicate glass, phosphorus silicate glass, SiOF, SiN, SiON, spin-on-glass, a flowable oxide, and an insulating polymer.

6. A method according to claim 1 wherein said second conductive layer comprises a material chosen from the group consisting of tungsten, aluminum, copper, polycrystalline silicon, a tungsten-silicon compound, an aluminum-copper compound, and an aluminum-copper-silicon compound.

7. A method according to claim 1 wherein said steps of polishing said second conductive layer and polishing said insulating layer comprise separate chemical mechanical polishing steps.

8. A method for forming a contact plug for a microelectronic device, said method comprising the steps of:
   forming an insulating layer on a microelectronic substrate having a first conductive layer;
   forming a contact hole in said insulating layer wherein said contact hole exposes a portion of said first conductive layer;

forming a second conductive layer on said insulating layer opposite said microelectronic substrate and in said contact hole;

polishing said second conductive layer thereby exposing a surface of said insulating layer; and polishing said insulating layer;

wherein said steps of polishing said second conductive layer and polishing said insulating layer comprise separate chemical mechanical polishing steps;

wherein said step of polishing said second conductive layer is performed on a first polishing plate of a chemical-mechanical polishing system, and wherein said step of polishing said insulating layer is performed on a second polishing plate of said chemical-mechanical polishing system.

9. A method according to claim 1 wherein said step of polishing said second conductive layer is performed using a polishing agent that polishes away said second conductive layer at a higher rate than said insulating layer.

10. A method according to claim 1 wherein said step of polishing said insulating layer is performed using a polishing agent that polishes away said insulating layer at a higher rate than said second conductive layer.

11. A method according to claim 1 further comprising the step of cleaning the microelectronic substrate between said steps of polishing said second conductive layer and polishing said insulating layer.

12. A method according to claim 1 wherein said step of forming said second conductive layer is preceded by the step of:

forming a barrier layer on said insulating layer and in said contact hole and wherein said step of polishing said second conductive layer comprises polishing said barrier layer thereby exposing said insulating layer.

13. A method according to claim 12 wherein said barrier layer comprises a material chosen from the group consisting of titanium, titanium nitride, and tungsten nitride.

14. A method according to claim 1 wherein said first conductive layer comprises a source/drain region or a wiring pattern.

15. A method according to claim 1 wherein said second conductive layer comprises a wiring pattern.

16. A method according to claim 1 wherein said step of polishing said insulating layer and said step of polishing said second conductive layer are performed using a polishing agent that polishes away said insulating layer and said second conductive layer at a common rate.

17. A method for forming a contact plug for a microelectronic device, said method comprising the steps of:

forming a first insulating layer on a microelectronic substrate having a first conductive layer wherein said first insulating layer has recessed portions therein;

forming a second insulating layer in said recessed portions of said first insulating layer;

forming a third insulating layer on said first and second insulating layers;

forming a contact hole in said first and third insulating layers wherein said contact hole exposes a portion of said first conductive layer;

forming a second conductive layer on said third insulating layer opposite said microelectronic substrate and in said contact hole;

polishing said second conductive layer to thereby expose a surface of said third insulating layer; and polishing said third insulating layer.

18. A method according to claim 17 wherein said step of polishing said third insulating layer follows said step of polishing said second conductive layer.

19. A method according to claim 17 wherein said surface of said third insulating layer is planarized during said step of polishing said third insulating layer.

20. A method according to claim 17 wherein said second conductive layer comprises a material chosen from the group consisting of a metal, a metal compound, and polycrystalline silicon.

21. A method according to claim 17 further comprising the step of forming a dummy pattern on said microelectronic substrate between portions of said first conductive layer.

22. A method according to claim 21 wherein said steps of forming said first conductive layer and forming said dummy pattern are performed simultaneously.

23. A method according to claim 17 wherein said first and third insulating layers each comprise a material chosen from the group consisting of $SiO_2$, undoped silicate glass, boron phosphorous silicate glass, phosphorus silicate glass, SiOF, SiN, and SiON.

24. A method according to claim 17 wherein each of said steps of forming said first insulating layer and forming said third insulating layer comprises using a deposition chosen from the group consisting of a low pressure chemical vapor deposition and a plasma enhanced chemical vapor deposition.

25. A method according to claim 17 wherein said step of forming said second insulating layer comprises the steps of:

forming a layer of an insulating material on said first insulating layer and in said recesses in said first insulating layer; and etching back said layer of said insulating material to expose portions of said first insulating layer between said recesses.

26. A method according to claim 17 wherein said second insulating layer comprises a material chosen from the group consisting of spin-on-glass, a flowable oxide, and an insulating polymer.

27. A method according to claim 17 wherein said second conductive layer comprises a material chosen from the group consisting of tungsten, aluminum, copper, polycrystalline silicon, a tungsten-silicon compound, an aluminum-copper compound, and an aluminum-copper-silicon compound.

28. A method according to claim 17 wherein said steps of polishing said second conductive layer and polishing said third insulating layer comprise separate chemical mechanical polishing steps.

29. A method according to claim 28 wherein said step of polishing said second conductive layer is performed on a first polishing plate of a chemical-mechanical polishing system, and wherein said step of polishing said third insulating layer is performed on a second polishing plate of said chemical-mechanical polishing system.

30. A method according to claim 17 wherein said step of polishing said second conductive layer is performed using a polishing agent that polishes away said second conductive layer at a higher rate than said insulating layer.

31. A method according to claim 17 wherein said step of polishing said third insulating layer is performed using a polishing agent that polishes away said third insulating layer at a higher rate than said conductive layer.

32. A method according to claim 17 further comprising the step of cleaning the microelectronic substrate between said steps of polishing said second conductive layer and polishing said third insulating layer.

33. A method according to claim 17 wherein said step of forming said second conductive layer is preceded by the step of:

forming a barrier layer on said insulating layers and in said contact hole and wherein said step of polishing said second conductive layer comprises polishing said barrier layer thereby exposing said insulating layer.

34. A method according to claim 33 wherein said barrier layer comprises a material chosen from the group consisting of titanium, titanium nitride, and tungsten nitride.

35. A method according to claim 17 further comprising the steps of:

forming a third conductive layer on said insulating layers; and forming a fourth insulating layer on said third conductive layer.

36. A method according to claim 34 wherein said third conductive layer comprises a second wiring pattern.

37. A method according to claim 17 wherein said first conductive layer comprises a source/drain region or a wiring pattern.

38. A method according to claim 17 wherein said second conductive layer comprises a wiring pattern.

39. A method according to claim 17 wherein said step of polishing said third insulating layer and said step of polishing said second conductive layer are performed using a polishing agent that polishes away said third insulating layer and said second conductive layer at a common rate.

* * * * *

UNITED STATES PATENT AND TRADEMARK OFFICE
CERTIFICATE OF CORRECTION

PATENT NO. : 5,960,310
DATED : September 28, 1999
INVENTOR(S) : In-kwon Jeong

It is certified that error appears in the above-identified patent and that said Letters Patent is hereby corrected as shown below:

In the Claims:

Claim 36, line 1 should read:
"36. A method according to claim 35 wherein said third"

Signed and Sealed this

Eleventh Day of July, 2000

*Attest:*

*Attesting Officer*

Q. TODD DICKINSON

*Director of Patents and Trademarks*